(12) United States Patent
Kim et al.

(10) Patent No.: US 7,904,044 B2
(45) Date of Patent: Mar. 8, 2011

(54) AUTOMATIC GAIN CONTROL APPARATUS AND METHOD IN MOBILE COMMUNICATION SYSTEM

(75) Inventors: Jun-Woo Kim, Daejeon (KR); Hyeong-Sook Park, Daejeon (KR); Youn-Ok Park, Daejeon (KR)

(73) Assignees: Electronics and Telecommunications Research Institute, Daejeon (KR); Samsung Electronics Co., Ltd., Suwon-si (KR)

(*) Notice: Subject to any disclaimer, the term of this patent is extended or adjusted under 35 U.S.C. 154(b) by 692 days.

(21) Appl. No.: 11/925,726

(22) Filed: Oct. 26, 2007

(65) Prior Publication Data

US 2008/0119152 A1    May 22, 2008

(30) Foreign Application Priority Data

Nov. 16, 2006    (KR) .................. 10-2006-0113289

(51) Int. Cl.
*H04B 1/06* (2006.01)
(52) U.S. Cl. .................. 455/234.1; 455/245.1
(58) Field of Classification Search .............. 455/232.1, 455/234.1, 234.2, 245.1, 250.1, 253.2; 375/345
See application file for complete search history.

(56) References Cited

U.S. PATENT DOCUMENTS

| | | | |
|---|---|---|---|
| 6,128,333 A | 10/2000 | Kinoshita et al. | |
| 6,512,917 B1 | 1/2003 | Hiramatsu | |
| 6,671,308 B2 | 12/2003 | Lomp | |
| 7,058,425 B1 | 6/2006 | Takakusaki | |
| 7,418,242 B2 * | 8/2008 | Sumasu et al. ............ | 455/70 |

FOREIGN PATENT DOCUMENTS

| | | |
|---|---|---|
| KR | 10-1997-7007646 A | 12/1997 |
| KR | 10-2001-0023396 A | 3/2001 |
| KR | 10-2001-0074768 A | 8/2001 |
| KR | 1020040090528 A | 10/2004 |
| KR | 10-2004-0108203 A | 12/2004 |

OTHER PUBLICATIONS

Weon-Cheol Lee and Seung-Won Choi, "A Survey of Essential Considerations in the Design of Downlink Beamforming of Smart Antenna System", pp. 627-966, 2003.
Alan V. Oppenheim & Ronald W. Schafer, "Discrete-Time Signal Processing", 2nd Edition, p. 193-197.

* cited by examiner

*Primary Examiner* — Blane J Jackson
(74) *Attorney, Agent, or Firm* — Jefferson IP Law, LLP

(57) ABSTRACT

The present invention relates to an automatic gain control apparatus and method in a mobile communication system. According to the automatic gain control apparatus of an embodiment of the invention, when downlink signals include both directional beam signals and beam signals traveling in all directions due to the antenna system, different reception gain reference values are used according to whether downlink signals including only the beam signals traveling in all directions are received or downlink signals including the directional beam signals are received, thereby controlling the gain of the received signal. When the downlink signals including the directional beam signals are received, the automatic gain control apparatus can appropriately control the gain of the received signal on the basis of the directional beam signals to prevent saturation of the received signal. Further, in a place where the channel condition between the terminal and the base station is bad, such as the boundaries between the cells, the reception gain is controlled on the basis of the reception gain reference value that is set in correspondence with the beam signal traveling in all directions, which makes it possible to reduce the loss of a signal-to-noise ratio (SNR).

16 Claims, 3 Drawing Sheets

AUTOMATIC GAIN CONTROL APPARATUS AND METHOD IN MOBILE COMMUNICATION SYSTEM

CROSS-REFERENCE TO RELATED APPLICATION

This application claims priority to and the benefit of Korean Patent Application No. 10-2006-0113289 filed in the Korean Intellectual Property Office on Nov. 16, 2006, the entire content of which is incorporated herein by reference.

BACKGROUND OF THE INVENTION (a) Field of the Invention

The present invention relates to an automatic gain control apparatus in a mobile communication system. More particularly, the present invention relates to an automatic gain control apparatus for demodulating downlink signals, including directional beams and beams traveling in all directions that are divided over time, that are transmitted by a smart antenna system in an orthogonal frequency division multiplexing (OFDM) time division duplex (TDD) system.

(b) Description of the Related Art

In recent years, studies on a smart antenna technique, which is a solution for the deterioration of performance of a mobile communication system due to interference signals and channel characteristics, have been actively conducted. Unlike the existing structure in which two diversity antennas are used to combine multipath signals, the smart antenna technique uses an array antenna and a high-performance digital signal processing technique to control an adaptive antenna beam pattern according to a variation in the radio frequency (RF) signal environment to maximize transmitting/receiving performance and capacity. That is, according to the smart antenna technique, unlike the related art in which beams are emitted in all directions, directional beams are emitted to a corresponding subscriber to minimize signal interference of all of the subscribers in a sector, thereby improving communication quality and system channel capacity.

In wireless broadband Internet (WiBro), which is a typical OFDM TDD system, downlink signals used for the smart antenna technique are composed of only the beams traveling in all directions, or directional beams and beams traveling in all directions that are divided over time.

When the downlink signals are composed of only the beams traveling in all directions, a preamble section that is important to perform synchronization is greatly boosted and then transmitted.

Meanwhile, when the downlink signals include user data that travels in all directions and user data that travels directionally, the size of the user data traveling directionally is larger than that of the user data traveling in all directions. The reason is that the beams traveling in all directions are transmitted from one antenna, but the user data transmitted with the directional beams is the sum of signals transmitted from several antennas. Therefore, the size of the user data transmitted with the directional beams is larger than that of the user data transmitted with the beams traveling in all directions by the number of antennas.

An automatic gain control apparatus of a terminal adaptively varies the gains of signals received according to the channel conditions to optimize a demodulating performance.

When the downlink signal is received, first, the automatic gain control apparatus performs variable gain amplification on the received downlink signal and converts the analog signal into digital data. Then, the automatic gain control apparatus uses the converted digital data to calculate the gain, and accumulates the gain during a preamble section to calculate an average value. The automatic gain control apparatus calculates the difference between a reception gain reference value and the reception gain average value during the preamble section, and converts the difference into an analog value. Then, the analog value of the difference is fed back to a variable gain amplifying stage, and is then used to amplify subsequent user data.

In this case, a maximum value of the received signal is set as the reception gain reference value. In a general OFDM system, the automatic gain control apparatus determines the reception gain reference value on the basis of the size of a preamble signal transmitted from the base station. This is because the user data has a variable size, but preamble data has a substantially constant size since a predetermined signal is transmitted.

Meanwhile, during the amplification of the gain of the received signal and the A/D conversion of the amplified signal, whenever the result of the A/D conversion increases one bit by one bit according to the degree of amplification of the gain, a signal-to-noise ratio (SNR) due to a quantization error is improved by 6 dB. On the other hand, when the size of a signal excessively increases due to gain amplification, clipping occurs during an A/D conversion. Therefore, the accurate adjustment of the size of the signal in the variable gain amplifying stage greatly affects the demodulating performance. That is, the automatic gain control apparatus needs to appropriately adjust the gain of a received signal so as to obtain an optimum SNR within the range in which clipping does not occur during an A/D conversion.

Meanwhile, when the downlink signals include both the directional beams and the beams traveling in all directions, the automatic gain control apparatus according to the related art controls the gain of a received signal using only one reception gain reference value corresponding to a preamble signal or the size of the directional beam signal. In this case, when the reception gain reference value is set on the basis of a received signal that is transmitted with the directional beam, a received signal transmitted with the beams traveling in all directions is not sufficiently amplified, resulting in the loss of the SNR. This characteristic may cause serious problems when the terminal is disposed in a place where a channel environment is bad, such as at a cell edge. On the other hand, when the reception gain reference value is set on the basis of the preamble signal, similar to the case in which only the beam signals traveling in all directions are received, the received signal transmitted with the directional beam is excessively amplified, which results in clipping.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an automatic gain control apparatus capable, when a terminal receives downlink signals including both directional beams and beams traveling in all directions that are transmitted by a smart antenna system, of controlling the degree of amplification of signals that are transmitted with both the directional beams and the beams traveling in all directions such that saturation and clipping do not occur in the signals, while obtaining an optimum signal-to-noise ratio.

According to an embodiment of the invention, there is provided an automatic gain control apparatus for receiving downlink signals having both beam signals traveling in all directions and directional beam signals, and demodulating the downlink signals in a terminal.

The automatic gain control apparatus includes: a variable gain amplifier that amplifies the downlink signals according to a reception gain amplification value indicating the degree of amplification of a received signal; a reference value setting unit that outputs different reception gain reference values according to whether the downlink signal includes the directional beam signal; an average calculating unit that accumulates the gain of the signal amplified by the variable gain amplifier during a preamble section of the downlink signal and outputs a reception gain average value; and an adder that outputs a gain difference between the reception gain reference value and the average reception gain respectively received from the reference value setting unit and the average calculating unit as the reception gain amplification value of the variable gain amplifier.

According to another embodiment of the invention, there is provided an automatic gain control method of receiving downlink signals having both beam signals traveling in all directions and directional beam signals, and demodulating the downlink signals in a terminal.

The automatic gain control method includes: amplifying the downlink signal according to a reception gain amplification value; calculating a reception gain average value of the downlink signal; calculating a gain difference between the reception gain average value and the reception gain reference value that is set according to whether the downlink signal includes the directional beam signal; and changing the reception gain amplification value on the basis of the gain difference.

According to still another embodiment of the invention, there is provided an automatic gain control method of receiving downlink signals having both beam signals traveling in all directions and directional beam signals, and demodulating the downlink signals in a terminal.

The automatic gain control method includes: controlling a reception gain of the downlink signal on the basis of the beam signals traveling in all directions; recognizing that the terminal requests a base station to transmit the directional beam signal; and controlling the reception gain of the downlink signal on the basis of the directional beam signal.

DETAILED DESCRIPTION OF THE EMBODIMENTS

Figure 1:
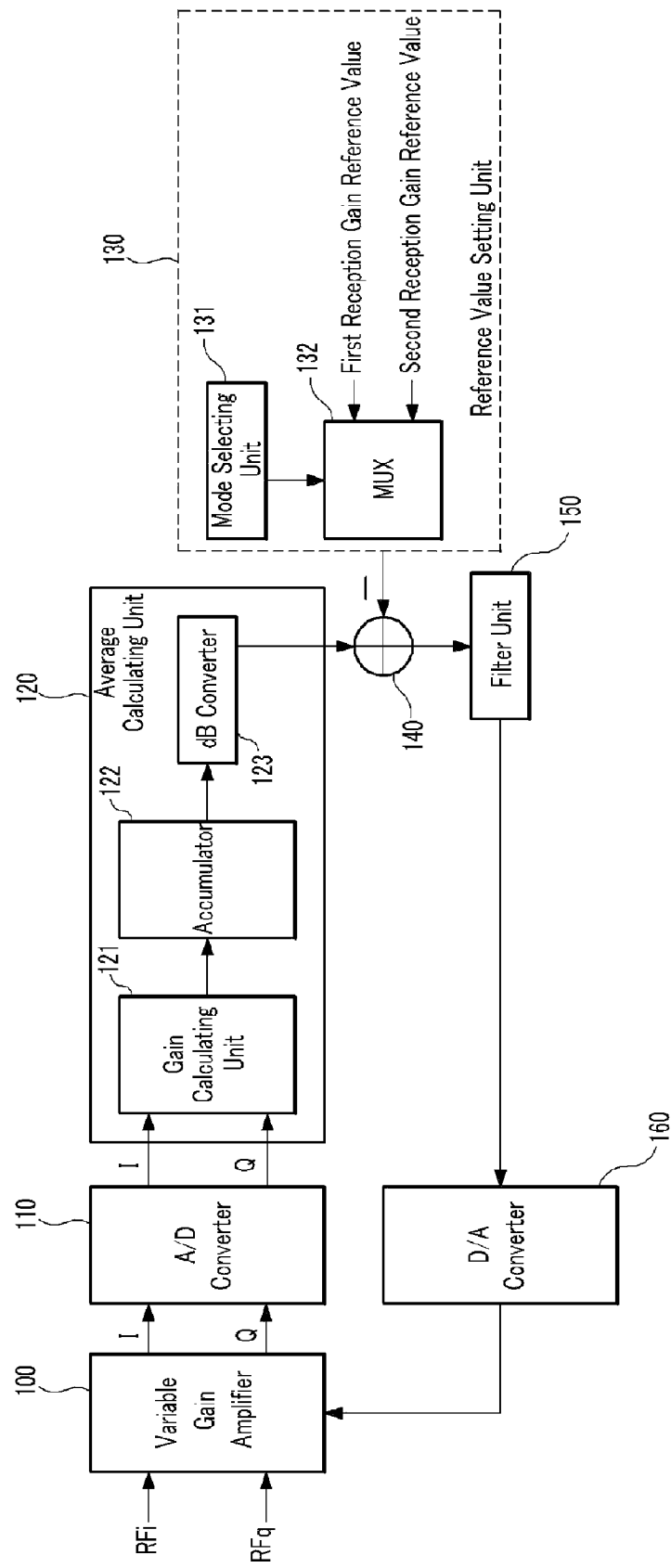
FIG. 1 is a block diagram illustrating an automatic gain control apparatus in a mobile communication system according to an exemplary embodiment of the present invention.

In the following detailed description, only certain exemplary embodiments of the present invention have been shown and described, simply by way of illustration. However, as those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

It will be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, an automatic gain control apparatus of a mobile communication system according to an exemplary embodiment of the present invention will be described in detail with reference to the accompanying drawings.

FIG. 1 is a block diagram illustrating an automatic gain control apparatus of a terminal according to an exemplary embodiment of the present invention.

As shown in FIG. 1, the automatic gain control apparatus includes a variable gain amplifier (hereinafter, referred to as a "VGA") 100, an analog/digital converter (hereinafter, referred to as an "A/D converter") 110, an average calculating unit 120, a reference value setting unit 130, an adder 140, a filter unit 150, and a digital/analog converter (hereinafter, referred to as a "D/A converter") 160.

The VGA 100 receives a downlink signal and amplifies the received signal according to an amplification value. In this case, the amplification value used is updated to correspond to a received signal whenever one frame is received.

The A/D converter 110 converts signals output from the VGA 100 into digital signals.

The average calculating unit 120 calculates the average gain of downlink signals. In this case, the average gain of the received signals is calculated by using the converted digital signal, and the average calculating unit 120 includes a gain calculating unit 121, an accumulator 122, and a dB converter 123.

The gain calculating unit 121 calculates gains using the digital signals received from the A/D converter 110. In this embodiment, for example, a method of calculating the sum of a square of I data and a square of Q data is used in order to calculate the gains.

The accumulator 122 accumulates the gains output from the gain calculating unit 121 to calculate the average gain. As described above, the method of calculating the sum of a square of the I data and a square of the Q data to calculate the average gain can be represented by Equation 1 below.

$$\text{Gain} = \frac{1}{N}\sum_{n=1}^{N}(Ri(n)^2 + Rq(n)^2).$$ [Equation 1]

In Equation 1, Ri and Rq indicate digital signals obtained by converting received analog signals RFi and RFq, and N indicates the length of a preamble section. The average gain is calculated by dividing the gains obtained during the preamble section by N.

Meanwhile, since the gain to be compensated by the automatic gain control apparatus is within the range of 80 to 100 dB, which is a large value, the average gain calculated by the accumulator 122 is changed to a dB value by the dB converter 123. The dB converter 123 includes a dB table, and when the average gain is input, the dB converter 123 reads a dB value corresponding to the input signal from the table and outputs the read value.

The reference value setting unit 130 sets a reception gain reference value, which is a standard for amplifying the gain of a received signal, and includes a mode selecting unit 131 and a multiplexer (hereinafter, referred to as a "MUX") 132. Here, the reception gain reference value means a value for setting the maximum value of a received signal. When directional beams are mixed in the downlink signal, the maximum value of the directional beam signal serves as the reception gain reference value. When downlink signals include only the beams traveling in all directions, the maximum value of a preamble signal is set as the reception gain reference value.

The mode selecting unit 131 controls the MUX 132 to set the reception gain reference value according to whether the downlink signals include only the beam signals traveling in all directions or both directional beam signals and beam signals traveling in all directions.

The mode may be selected according to whether the directional beam is allocated to a corresponding terminal. In this case, the following methods may be used to determine whether the directional beam is allocated to a corresponding terminal. According to one method, MAP information among downlink received signals is demodulated to determine whether the directional beam signal exists. According to another method, it is determined whether the directional beam is allocated to a corresponding terminal, using the fact that, when a terminal requests a base station to transmit a directional beam signal, the directional beam signal is transmitted to the terminal after a predetermined time has elapsed.

In the former case, first, the MAP information should be decoded to determine whether the downlink signal includes the directional beam signal. Therefore, saturation occurs in a first directional beam signal that is received during the decoding of the MAP information due to excessive amplification of the reception gain, which may cause clipping. Meanwhile, in the latter case, the request of the terminal to transmit the directional beam signal means that the terminal is in a good signal reception condition and the current condition is line-of-sight (LOS). Therefore, in this situation, even when the reception gain is adjusted according to the size of the directional beam signal, it is possible to receive sufficient beam signals traveling in all directions and to demodulate the received beam signals.

That is, even when user data is received with the directional beam signal, the user data should be synchronized with a preamble signal and MAP information should be continuously received, in order to demodulate the user data. Therefore, the terminal can accurately receive beam signals traveling in all directions. Even though the reception gain is adjusted according to the size of the directional beam signal, the terminal requests the base station to transmit the directional beam signal only in the condition that the downlink signal can be demodulated. The request of the terminal for the directional beam signal terminal is transmitted to the base station by control software of the terminal. The mode selecting unit 131 transmits a selection signal corresponding to the directional beam request signal to the MUX 132. The mode selecting unit 131 transmits a selection signal to the MUX 132 to set the reception gain reference value suitable for the beam signal traveling in all directions according to the link conditions, when the terminal no longer requires the directional beam signal.

The MUX 132 selects a first reception gain reference value corresponding to the size of the preamble signal or a second reception gain reference value corresponding to the size of the directional beam signal on the basis of the selection signal from the mode selecting unit 131 and outputs the selected value.

The adder 140 calculates the difference between the average reception gain during the preamble section that has been converted into a dB value by the average calculating unit 120 and the reception gain reference value that is output from the reference value setting unit 130. The calculated difference is converted into an analog signal by the D/A converter 160, and is then fed back to the VGA 100. Then, the signal is used to amplify the user data in the downlink frame.

In the automatic gain control apparatus, the filter unit 150 is provided in the front state of the D/A converter 160 to accumulate the difference for every frame, and serves as a low pass filter for preventing rapid variation in gain. In addition, the filter unit 150 clears the accumulated difference whenever the reception gain reference value is changed, and starts accumulating the difference again.

Next, an automatic gain control method in a mobile communication system according to an exemplary embodiment of the present invention will be described in detail with reference to the accompanying drawings.

Figure 2:
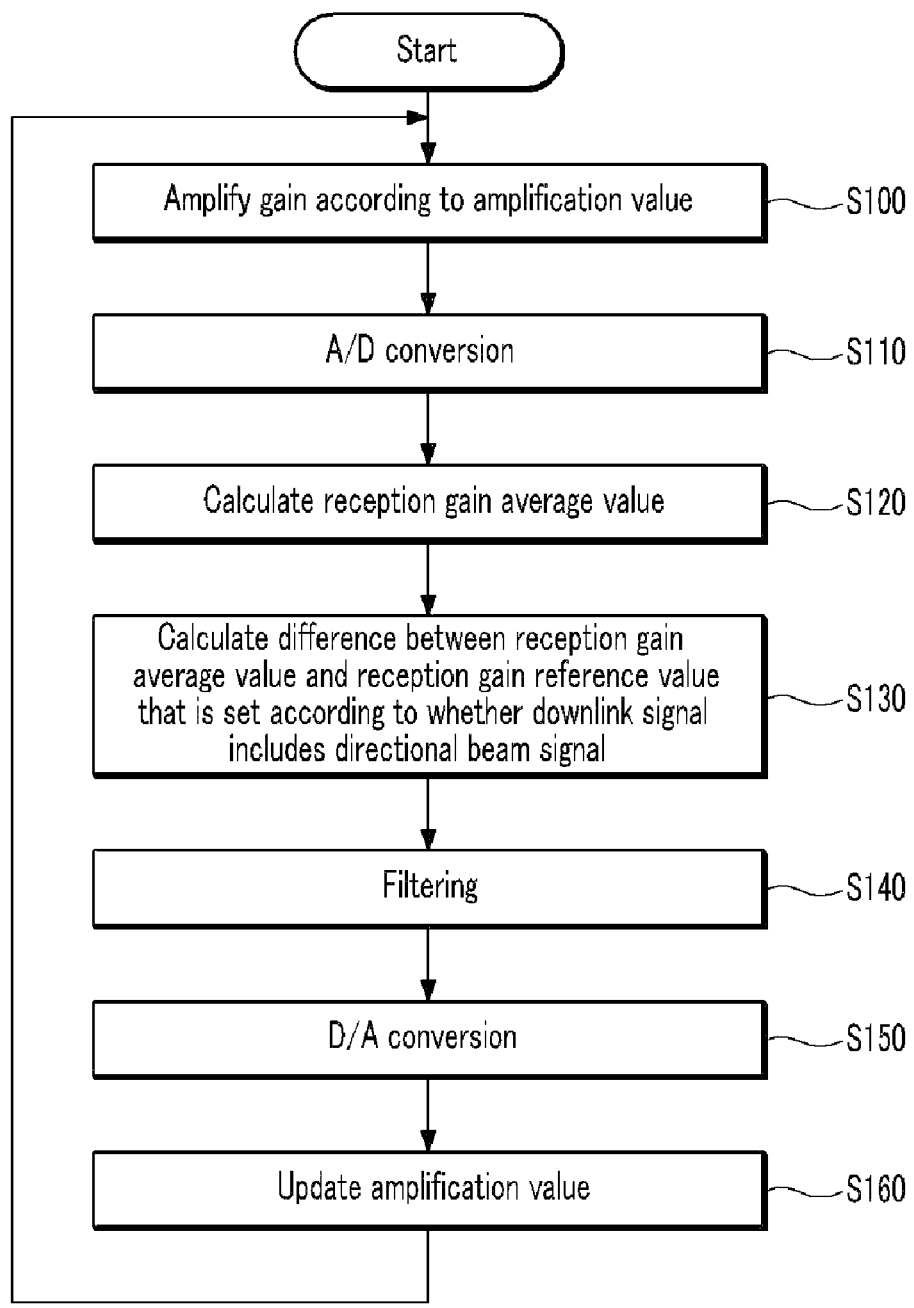
FIG. 2 is a flowchart illustrating an automatic gain control method in a mobile communication system according to an exemplary embodiment of the present invention.

FIG. 2 is a flowchart illustrating an automatic gain control method according to an exemplary embodiment of the present invention.

As shown in FIG. 2, when a terminal starts receiving a downlink signal, the VGA 100 amplifies the received downlink signal (S100). At that time, the received signal is amplified according to a predetermined amplification value, which is continuously updated according to the state of a subsequent downlink signal that is received.

The amplified received signal is converted into a digital signal by the A/D converter 110 (S110). The average calculating unit 120 uses the digital signal to calculate a gain. The gain is accumulated during the preamble section, and the average of the accumulated gains during the preamble section is calculated (S120).

Then, the difference between the calculated average gain and the reception gain reference value set by the reference value setting unit 130 according to whether the downlink signal includes the directional beam signal is calculated (S130). The difference between the values is filtered (S140), and is then converted into an analog signal by the D/A converter 160 (S150). Then, the analog signal is fed back to the variable gain amplifier. The difference fed back to the variable gain amplifier updates an amplification value for determining the degree of amplification of the variable gain amplifier 100 (S160), so that the variable gain amplifier 100 can appropriately amplify the user data received in a corresponding frame.

Figure 3:
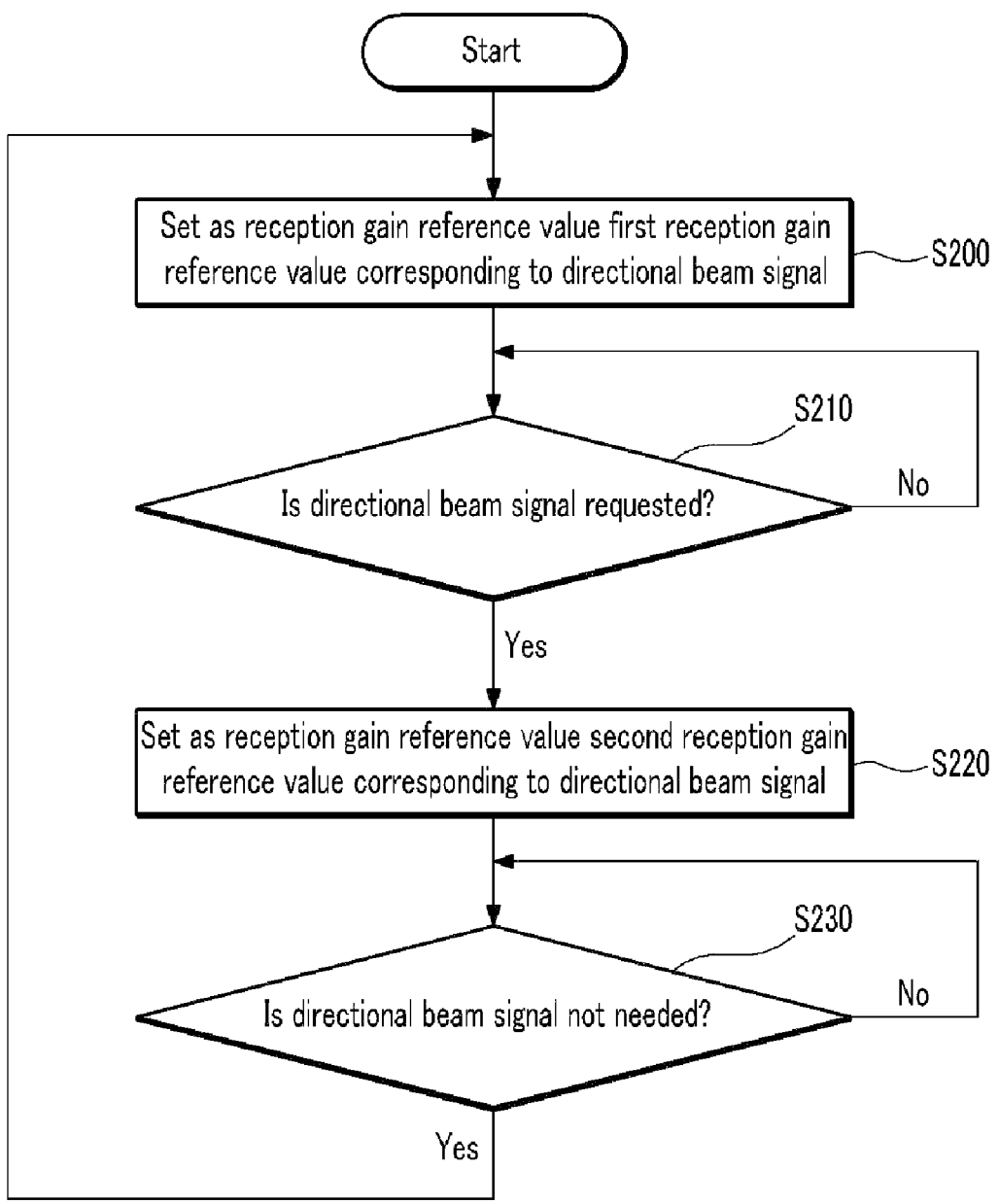
FIG. 3 is a flowchart illustrating a method of setting a reception gain reference value in a mobile communication system according to an exemplary embodiment of the present invention.

FIG. 3 is a flowchart illustrating a method of setting the reception gain reference value in a mobile communication system using an automatic gain control apparatus according to an exemplary embodiment of the invention.

As shown in FIG. 3, when a terminal receives a downlink signal including only the beams traveling in all directions, first, a first reception gain reference value is set as the reception gain reference value (S200). That is, the size of a signal in a preamble section is set as the reception gain reference value, which is the maximum value of a received signal. In this case, the size of a preamble signal is predetermined according to the agreement between the base station and the terminal.

When the terminal determines the reception state of signals and requests the base station to transmit a directional beam signal on the basis of the result of the determination (S210), the automatic gain control apparatus sets as the reception gain reference value a second reception gain reference value that corresponds to when the downlink signal includes the directional beam signal (S220). That is, the automatic gain control apparatus sets the size of the directional beam signal as the reception gain reference value, which is a fixed value determined according to the agreement between the base station and terminals.

Then, when the base station does not allocate the directional beam signal to a corresponding terminal for a long time under any circumstances, the terminal requests the base station to transmit the directional beam signal. In this case, the automatic gain control apparatus of the terminal maintains the second reception gain reference value as the reception gain reference value. On the other hand, when the terminal does not need the directional beam signal under link conditions, the automatic gain control apparatus changes the reception gain reference value to the first reception gain reference value that corresponds to the structure in which the downlink signal includes only the beams traveling in all directions.

As described above, according to the automatic gain control method and apparatus for using different reception gain reference values according to whether the downlink signal includes the directional beam signal to control the gain of a received signal, when a downlink signal including the directional beam signal is received, it is possible to appropriately control the gain of the received signal and thus prevent saturation of the received signal. When a terminal requests the base station to transmit the directional beam signal, it is possible to perform gain control using a reception gain reference value that is set to correspond to the beams traveling in all directions or the directional beam signal, thereby performing demodulation, since the terminal is in a good signal reception state. Meanwhile, in a place where the channel condition between the terminal and the base station is bad, such as at the boundaries between cells, the reception gain is controlled on the basis of the reception gain reference value that is set in correspondence with the beam signal traveling in all directions, which makes it possible to reduce the loss of a signal-to-noise ratio (SNR).

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

According to an exemplary embodiment of the present invention, as described above, in an automatic gain control method and apparatus for using different reception gain reference values according to whether a downlink signal includes a directional beam signal to control the gain of a received signal, when the downlink signal including the directional beam signal is received, it is possible to appropriately control the gain of the received signal to prevent saturation of the received signal. Further, in a place where the channel condition between the terminal and the base station is bad, such as at the boundaries between the cells, the reception gain is controlled on the basis of the reception gain reference value that is set in correspondence with the beam signal traveling in all directions, which makes it possible to reduce the loss of a signal-to-noise ratio (SNR).

What is claimed is:

1. An automatic gain control apparatus for receiving downlink signals comprising both a beam signal traveling in all directions and a directional beam signal and demodulating the downlink signals in a terminal, the apparatus comprising:
   a variable gain amplifier that amplifies the downlink signals according to a reception gain amplification value indicating a degree of amplification of a received signal;
   a reference value setting unit that outputs different reception gain reference values according to whether the downlink signal includes the directional beam signal;
   an average calculating unit that accumulates a gain of the signal amplified by the variable gain amplifier during a preamble section of the downlink signal and outputs a reception gain average value; and
   an adder that outputs a gain difference between the reception gain reference value and the average reception gain respectively received from the reference value setting unit and the average calculating unit as the reception gain amplification value of the variable gain amplifier.

2. The automatic gain control apparatus of claim 1, further comprising:
   an Analog to Digital (A/D) converter that converts the signal received from the variable gain amplifier into a digital signal and outputs the converted signal;
   a filter unit that accumulates the gain difference output from the adder, filters the accumulated value, and outputs the filtered value; and
   a Digital to Analog (D/A) converter that converts the gain difference filtered by the filter unit into an analog signal and outputs the converted signal to the variable gain amplifier,
   wherein the average calculating unit calculates the gain of the downlink signal on a basis of the digital signal output from the A/D converter, and
   the variable gain amplifier sets the reception gain amplification value on a basis of the analog signal output from the D/A converter.

3. The automatic gain control apparatus of claim 2, wherein the filter unit clears the accumulated gain difference whenever the reception gain reference value is changed.
   the variable gain amplifier sets the reception gain amplification value on a basis of the analog signal output from the D/A converter.

4. The automatic gain control apparatus of claim 1, wherein the average calculating unit comprises:
   a gain calculating unit that calculates a gain of the downlink signal;
   an accumulator that accumulates the gain of the downlink signal received from the gain calculating unit during the preamble section and outputs an average value; and
   a dB (decibel) converter that converts the average value output from the accumulator into a dB value and outputs the reception gain average value.

5. The automatic gain control apparatus of claim 1, wherein the reference value setting unit comprises:
   a mode selecting unit that outputs a selection signal corresponding to whether the downlink signal includes the directional beam signal; and
   a multiplexer that outputs one of a first reception gain reference value and a second reception gain reference value as the reception gain reference value on a basis of the selection signal received from the mode selecting signal.

6. The automatic gain control apparatus of claim 5, wherein the mode selecting unit outputs the selection signal according to whether the terminal requests to transmit the directional beam signal.

7. The automatic gain control apparatus of claim 5,
   wherein the reception gain reference value corresponds to a maximum gain of the received signal,
   the first reception gain reference value corresponds to a size of the preamble signal determined by an agreement between the terminal and a base station, and the second reception gain reference value corresponds to a size of the directional beam signal determined by the agreement between the terminal and the base station.

8. An automatic gain control method of receiving downlink signals comprising both a beam signal traveling in all directions and a directional beam signal and demodulating the downlink signals in a terminal, the method comprising:
amplifying the downlink signal according to a reception gain amplification value;
calculating a reception gain average value of the downlink signal;
calculating a gain difference between the reception gain average value and a reception gain reference value that is set according to whether the downlink signal includes the directional beam signal; and
changing the reception gain amplification value on a basis of the gain difference.

9. The automatic gain control method of claim 8, wherein a criterion for determining whether the downlink signal includes the directional beam signal corresponds to whether the terminal requests a base station to transmit the directional beam signal.

10. The automatic gain control method of claim 8, wherein the changing of the reception gain amplification value comprises:
accumulating the gain difference and filtering the accumulated value;
converting the filtered gain difference into an analog signal; and
setting the reception gain amplification value on a basis of the analog signal.

11. The automatic gain control method of claim 8, wherein the reception gain average value is obtained by accumulating gains of the received signal during a preamble section of the downlink signal and averaging the accumulated gains.

12. The automatic gain control method of claim 11, wherein a size of the directional beam signal and a size of the preamble signal set on a basis of the reception gain reference value are determined by an agreement between the terminal and a base station.

13. An automatic gain control method of receiving downlink signals comprising both a beam signal traveling in all directions and a directional beam signal and demodulating the downlink signals in a terminal, the method comprising:
controlling a reception gain of the downlink signal on a basis of the beam signal traveling in all directions;
recognizing whether the terminal requests a base station to transmit the directional beam signal; and
controlling the reception gain of the downlink signal on a basis of the directional beam signal when the terminal has requested the base station to transmit the direction beam signal,
wherein the controlling of the reception gain of the downlink signal on the basis of the signal beams traveling in all directions comprises:
setting a reception gain reference value corresponding to a maximum size of the signal received by the terminal as a size of a preamble signal;
calculating a reception gain average value of the downlink signal and calculating a gain difference between the reception gain reference value and the reception gain average value; and
controlling the reception gain of the downlink signal on a basis of the gain difference.

14. The automatic gain control method of claim 13, further comprising: after the controlling of the reception gain of the downlink signal on the basis of the directional beam signal, when it is determined that the terminal does not require the directional beam signal, controlling the reception gain of the downlink signal on the basis of the beam signals traveling in all directions.

15. The automatic gain control method of claim 13, wherein the controlling of the reception gain of the downlink signal on the basis of the directional beam signal comprises:
setting a reception gain reference value corresponding to a maximum size of the signal received by the terminal as a size of the directional beam signal;
calculating a reception gain average value of the downlink signal and calculating a gain difference between the reception gain reference value and the reception gain average value; and
controlling the reception gain of the downlink signal on a basis of the gain difference.

16. The automatic gain control method of claim 13, wherein a degree of amplification of the reception gain of the downlink signal varies according to the gain difference, thereby controlling the reception gain.

* * * * *